United States Patent
Farr et al.

(10) Patent No.: US 9,039,908 B2
(45) Date of Patent: May 26, 2015

(54) POST ETCH REACTIVE PLASMA MILLING TO SMOOTH THROUGH SUBSTRATE VIA SIDEWALLS AND OTHER DEEPLY ETCHED FEATURES

(75) Inventors: Jon Farr, Vallejo, CA (US); Sharma Pamarthy, Hayward, CA (US); Khalid Sirajuddin, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1059 days.

(21) Appl. No.: 12/229,946

(22) Filed: Aug. 27, 2008

(65) Prior Publication Data

US 2010/0055400 A1 Mar. 4, 2010

(51) Int. Cl.
| | |
|---|---|
| *H01L 21/3065* | (2006.01) |
| *H01J 37/32* | (2006.01) |
| *H01L 21/02* | (2006.01) |
| *H01L 21/311* | (2006.01) |

(52) U.S. Cl.
CPC ..... *H01L 21/3065* (2013.01); *Y10T 428/24479* (2015.01); *H01J 37/321* (2013.01); *H01J 37/32146* (2013.01); *H01L 21/02057* (2013.01); *H01L 21/31138* (2013.01)

(58) Field of Classification Search
CPC ............ H01L 21/3065; H01L 21/3116; H01L 21/30655; H01L 21/31138; H01L 21/02057; H01J 37/321; H01J 37/32082; H01J 37/32146
USPC ......... 438/714, 706, 476, 719, 776, 689, 710, 438/202, 707, 712, 800, 725; 216/37, 67, 216/69, 57, 24; 428/156; 156/345.28
See application file for complete search history.

(56) References Cited

U.S. PATENT DOCUMENTS

| | | | |
|---|---|---|---|
| 4,795,529 A | 1/1989 | Kawasaki et al. ............. | 156/643 |
| 5,352,324 A | 10/1994 | Gotoh et al. .................. | 156/643 |
| 5,476,182 A * | 12/1995 | Ishizuka et al. ................ | 216/68 |
| 6,187,685 B1 * | 2/2001 | Hopkins et al. ............... | 438/710 |
| 6,566,270 B1 * | 5/2003 | Liu et al. ....................... | 438/706 |
| 6,593,244 B1 * | 7/2003 | Wang et al. ................... | 438/706 |
| 6,846,746 B2 | 1/2005 | Rattner et al. ................ | 438/706 |

(Continued)

FOREIGN PATENT DOCUMENTS

| | | | |
|---|---|---|---|
| CN | 101148765 | 3/2008 | ............... C23F 1/12 |
| JP | 2006165032 | 6/2006 | .......... H01L 21/3065 |

OTHER PUBLICATIONS

Boswell et al, Etching in a plasma, American Institute of Physics 1987, p. 3123-3129.*

(Continued)

*Primary Examiner* — Duy Deo
*Assistant Examiner* — Erin Bergner
(74) *Attorney, Agent, or Firm* — Shirley L. Church, Esq.

(57) ABSTRACT

A method of smoothing the sidewalls of an etched feature using reactive plasma milling. The method of smoothing reduces the depth of sidewall notching, which causes the roughness on the feature wall surface. The method comprises removing residual polymeric materials from the interior and exterior surfaces of said silicon-comprising feature and treating the interior surface of the silicon-comprising feature with a reactive plasma generated from a source gas while the silicon-comprising feature is biased with a pulsed RF power. The source gas includes a reagent which reacts with the silicon and an inert gas. The method provides a depth of a notch on the interior surface of about 500 nm or less.

16 Claims, 5 Drawing Sheets

(56) References Cited

U.S. PATENT DOCUMENTS

| | | |
|---|---|---|
| 2004/0097077 A1* | 5/2004 | Nallan et al. .................. 438/710 |
| 2004/0232106 A1* | 11/2004 | Oka et al. ........................ 216/26 |
| 2005/0170670 A1* | 8/2005 | King et al. .................... 438/800 |
| 2007/0030309 A1* | 2/2007 | McAvoy et al. ................ 347/54 |
| 2007/0281474 A1* | 12/2007 | Suzuki et al. ................. 438/677 |
| 2008/0023846 A1 | 1/2008 | Seki et al. ..................... 257/774 |

OTHER PUBLICATIONS

English translation of Kuniyone Kazuo, JP2006-012889, Dec. 2006.*

* cited by examiner

POST ETCH REACTIVE PLASMA MILLING TO SMOOTH THROUGH SUBSTRATE VIA SIDEWALLS AND OTHER DEEPLY ETCHED FEATURES

FIELD

Embodiments of the present invention relate to a method of smoothing the sidewalls of etched features subsequent to etching. The smoothing may be carried out in the same process chamber in which the feature etching was carried out, using a plasma milling technique.

BACKGROUND

This section describes background subject matter related to the disclosed embodiments of the present invention. There is no intention, either express or implied, that the background art discussed in this section legally constitutes prior art.

Deep recessed structure etching is one of the principal technologies currently being used to fabricate semiconductor and microstructure devices, and is an enabling technology for many microelectromechanical systems (MEMS) applications. Strict control of the etch profile is required for these new, complex devices to perform satisfactorily. Obtaining a controlled sidewall profile, where the taper angle ranges from about 85° to about 92° in combination with a smooth sidewall surface has proved a difficult task in many instances.

Through substrate vias (TSVs), which are frequently through silicon vias, with a sidewall taper angle ranging from about 85° to about 90° are particularly useful in various electronics packaging applications. The TSVs enable the attachment of various components to each other, frequently in manners which enable electrical connection from device to device. Etched silicon trenches with a sidewall taper angle of 85° up to 92° are useful in a variety of MEMS devices such as optical switches, tunable capacitors, accelerometers, and gyroscopes, by way of example and not by way of limitation.

Plasma etching of deeply recessed structures, where the depth of the recess is at least 10 μm, and may be as great as about 500 μm, typically requires a combination of reactive chemical etching with physical etching, which typically employs ion bombardment. The physical etching enables anisotropic, directional etching necessary to produce vertical sidewalls on an etched trench, for example.

Numerous processing techniques have been proposed for deep etching. One technique for forming trenches having nearly vertical sidewalls employs a protective coating in the area of the opening to the trench. The material used to form the coating is resistant to the etchant being used to etch the trench. The coating may be applied continuously or may be applied at specific points in the trench formation process. In a related method, a silicon substrate is covered with a patterned mask which exposes select areas of a silicon substrate to plasma etching. Anisotropic etching is accomplished using alternating plasma etching and polymer formation steps.

In other etching methods the same gas mixture is used during plasma etching of a feature and during formation of a protective film to protect etched surfaces. In one method, by changing the DC substrate bias, the process is said to be switched between a first state in which the primary reaction is substrate etching and a second state in which the primary reaction is deposition of a film on the substrate surface.

In another method, the etch and polymerization steps are carried out in an alternating, repetitive manner until etching is complete. It is possible to decrease the quantity of polymer deposited during the course of the polymer deposition steps, if desired.

In another method, etching of a trench in a semiconductor substrate is carried out using alternatively reactive ion etching and deposition of a passivation layer by chemical vapor deposition. The method includes varying one or more of a number of process variables with time during the etch process. The variation in process parameters is generally illustrated as being periodic, where the periodic variation corresponds to at least one sinusoidal, square, or sawtooth waveform. The method includes not only the cyclic process providing a reactive etching step followed by deposition of a passivation layer to protect sidewall surfaces, but also includes variance over time from process cycle to process cycle, as a means of avoiding the formation of significant surface roughness on the etched trench sidewalls. Such methods are complicated, requiring extensive process control apparatus and programmed computer control of the apparatus.

One disadvantages of the more recent deep feature etching processes which attempt to provide a smoother sidewall during etching of the feature is that the computerized control, combined with the apparatus functions which have to be carried out, tend to reduce the speed at which etching of the feature occurs. Further the complexity of the chemistry involved is increased, requiring the handling of more reactants, many of which are difficult to store and handle.

In yet another method, etching of deeply recessed features such as deep trenches of 5 μm or more in depth, a stabilizing etchant species is applied continuously throughout etching of the deeply recessed feature. The stabilizing etchant species is applied both during an etch step, in which an additional, different etchant species is applied intermittently, and during a polymer depositing step which is also applied intermittently during the deep feature etching process.

In another sidewall smoothing technique, sidewall smoothing is applied subsequent to etching of the deeply recessed feature into a silicon substrate. However, it appeared that this may have caused a surface porosity which was said to have been observed at the silicon sidewall surface after the smoothing method has been carried out. In some instances, where the amount of porosity present after the smoothing has been carried out may present a problem, some have tried oxidizing the silicon surface, followed by exposure to an HF dip or to vaporous HF to remove the oxide. Depending on the device which is being fabricated, there may be exposed elements of the device which cannot tolerate exposure to HF.

There remains a need for an improved method of etching deep features (more than 200 μm in depth, for example) which require a particularly smooth sidewall.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand exemplary embodiments of the invention and that certain well known processes and apparatus are not illustrated herein in order not to obscure the inventive nature of the subject matter of the disclosure.

FIGS. 3A-3C show changes in profile of the etched through silicon via which can be achieved during the reactive plasma milling (smoothing) process, by changing the process parameters.

FIGS. 4A and 4B show the effect on the surface of the side walls of an etched silicon via, where the un-stripped patterned photoresist layer and the polymer residue from the via etching process have not been removed prior to the reactive plasma milling of the sidewalls of the via.

FIGS. 5A and 5B illustrate the removal of the extended upper edge 503 of the etched through silicon via 504 which forms beneath a patterned photoresist mask used during plasma etching of the via.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

I. An Exemplary Apparatus for Practicing the Invention

The various exemplary embodiment examples of the reactive plasma milling process which are described herein were carried out in a DPS II TSV Processing Chamber available from Applied Materials, Inc., Santa Clara, Calif. The DPS II TSV Processing Chamber may be used as part of an Integrated Processing System, also available from Applied Materials, where transfer between a combination of different processing chambers (which make up an Integrated Processing System) enables a variety of processing procedures without exposing the substrate to the ambient environment. An advantageous Integrated Processing System is the Centura® Mainframe System, which is also available from Applied Materials, Inc.

Figure 1:
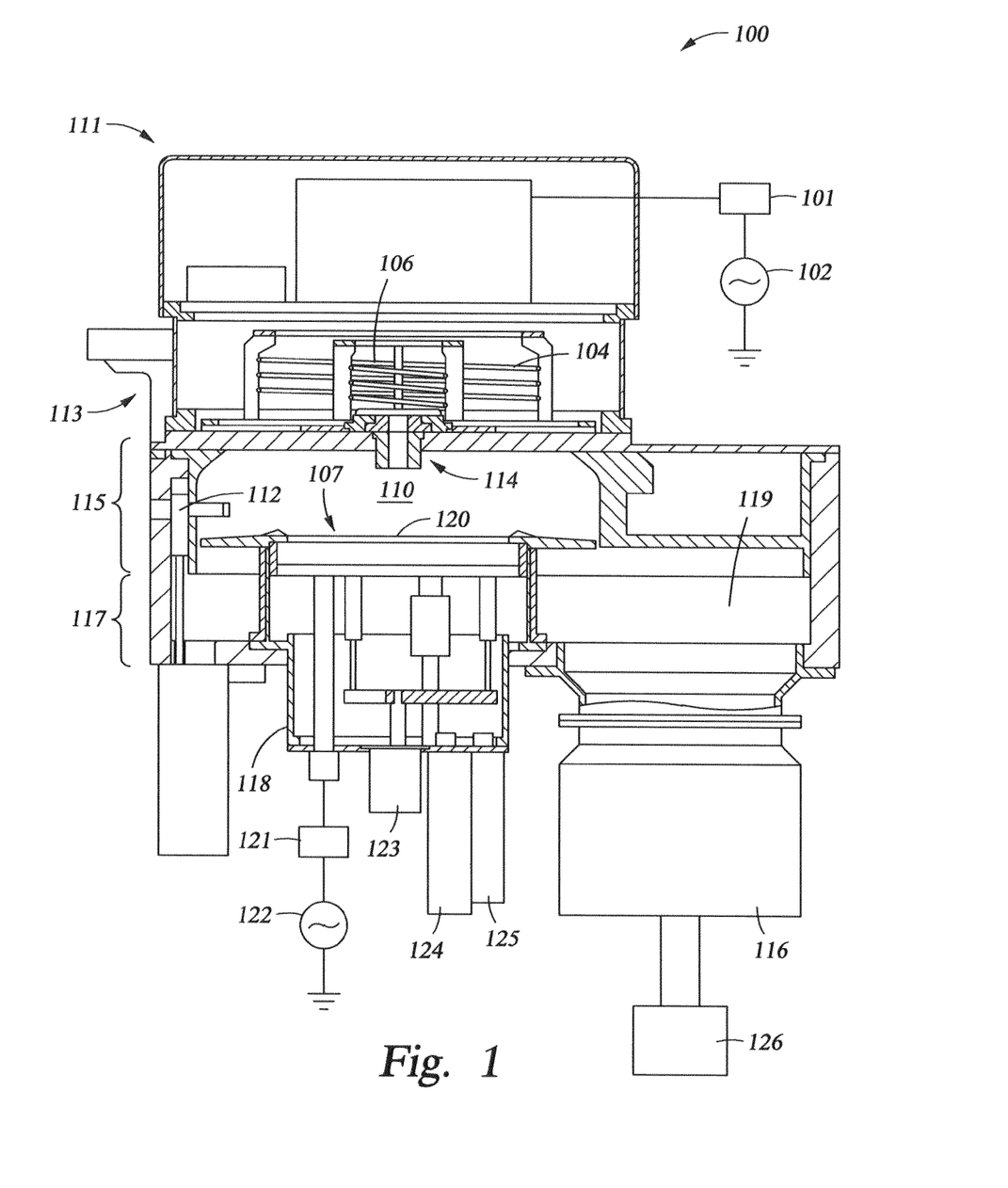
FIG. 1 is a schematic representative of a DPS II TSV inductively coupled plasma etch chamber 100 of the kind available from Applied Materials, Inc. This kind of plasma etch chamber was used during the experimentation leading to the present invention.

FIG. 1 shows an elevation schematic of the DPS II TSV Processing Apparatus 100. The DPS II TSV Processing Apparatus 100 is a fully automated semiconductor etch processing chamber of the kind which is typically employed as part of a multi-chamber, modular system (not shown) which may accommodates a variety of substrate sizes. The process apparatus used for experimentation supporting the disclosure herein included a DPS II TSV Upper Processing Chamber 115 having a processing volume 110 designed to accommodate a substrate diameter size up to 12 inch (300 mm).

The DPS II TSV Processing Apparatus 100 is configured to be mounted on a standard CENTURA® mainframe (not shown). The Processing Apparatus 100 includes a plasma source power 102 and matching network 101 which are in communication with power generating apparatus present within enclosure 111. The RF inductively coupled plasma source power 102 and matching network 101 operate at a frequency which is typically in the range of about 12 MHz to about 13.5 MHz (while this particular processing apparatus operates at this frequency, other processing apparatus which may be used operate at source power frequencies ranging up to 60 MHz), at a power in the range from 0.1 kW to about 5 kW. The upper processing chamber 115 makes use of an RF inductively coupled plasma (not shown) which is generated using inductive coils 104 and 106 which are located within an enclosure 113, just above upper processing chamber 115. Upper processing chamber 115 includes a processing chamber volume 110 of the size described above, and an electrostatic chuck (ESC) cathode 107. Plasma source gas is introduced into the upper processing chamber 115 through a fast gas exchange nozzle 114, to provide uniformed controlled gas flow distribution. Chamber pressure is controlled by a capacitance manometer control system (not shown). The processing chamber volume 110 present within upper processing chamber 115 is in communication with a lower processing chamber 117 which is in communication with a throttle valve 119 located above and in communication with a turbo pump 116, which is located above and in communication with a rough pump 126. When the Processing Apparatus 100 is in operation, new plasma source gas is continually charging to process chamber volume 110 and processing by-products are constantly exiting through the throttle valve 119, turbo pump 116 and rough pump 126.

During processing, a substrate (not shown) is introduced into the processing chamber volume 110 through inlet 112. The processing chamber volume 110 includes an electrostatic chuck (ESC) cathode 107 and an inlet from fast gas exchange nozzle 114. A substrate is placed on the cathode 107 during a particular process. Chamber pressure is controlled by a pressure control system (not shown) which activates various devices typically including the fast gas exchange nozzle 114, throttle valve 119, turbo pump 116 and rough pump 126. The substrate is held in place by a mechanism which employs a static charge generated on the surface of electrostatic chuck (ESC) cathode 107 by applying a DC voltage (not shown) to a conductive layer located under a dielectric film on the chuck surface 120. The electrostatic chuck/cathode 107 is typically cooled using a heat transfer device (not shown) cooled using a compression chiller (not shown) fed with fluid from inlet 124, which subsequently exits from outlet 125. The electrostatic chuck/cathode 107 and substrate (not shown) are raised and lowered by means of a wafer lift 123 for processing. Etch gases are introduced into an upper processing chamber 110 fast gas exchange manifold (not shown).

A controller (not shown) may be provided to control the operations of the Processing Apparatus 100, to carry out embodiments of the present invention. The substrate (not shown) is biased with an RF power 122 and matching network 121 operating within the range of 100 kHz to 13.56 MHZ; more typically, within the range of 100 kHz to 2 MHZ. Plasma source power 102 and substrate biasing power 122 are independently controlled Applied Materials, Inc. system software (not shown) which is provided at the controller. In particular, the RF biasing power 122 is pulsed using generator pulsing capability set by system controls (not shown) to provide a percentage of time that the power is on which is referred to as the "duty cycle". Typically the time on and time off of a pulsed bias power is uniform throughout substrate processing. In this instance, for example, if the power is on for 3 msec and off for 15 msec, the "duty cycle" would be 16.67%. The pulsing frequency in cycles per second (Hz) is equal to 1.0 divided by sum of the on and off time periods in seconds. For example, when the power is on for 3 msec and off for 15 msec, for a total of 18 msec, the pulsing frequency in cycles per second is 55.55 Hz. It would also be possible to use a specialized pulsing profile where the on/off timing changes during substrate processing for particular needs.

The temperature on the surface of the etch chamber walls is controlled using liquid-containing conduits (not shown) which are located in the walls of the upper etch chamber 115. The temperature of the semiconductor substrate is controlled using the temperature of the electrostatic chuck cathode 107 surface 120 upon which the substrate (not shown) rests. Typically, a helium gas flow is used to facilitate heat transfer between the substrate (not shown) and the cathode 107 surface 120. The heat transfer fluid used at the surface of the electrostatic chuck cathode is provided through a fluid conduit system (not shown).

As previously mentioned, although the etch process apparatus 100 used to process the substrates described in the Examples presented herein was an inductively coupled etch chamber of the kind shown in schematic in FIG. 1, any of the etch processors available in the industry which can essentially duplicate the process described herein should be able to take advantage of the teachings described herein, with some adjustment to the processing apparatus parameters. It is contemplated that other plasma etch processing apparatus known in the industry may be used to carry out various embodiments of the invention.

II. General Description

There are a number of instances where the depth to which a feature to be etched is in the range of 200 μm to 500 μm, or even greater. An example is through substrate vias (TSV) of the kind used in electronics packaging. Often such substrates are silicon-containing substrates, and may be referred to as through silicon vias, also TSV. Due to the depth of the etch required, a particularly rapid etch is required. The rate of etch which has been possible has been limited by the notching of the via sidewall which occurs during the etch process. The depth of notch which may be tolerated depends on the particular application. For example, in semiconductor device or packaging applications, where the feature is a via which is to be filled with copper, it is frequently necessary, depending on the substrate, to deposit a barrier layer over the etched via surface prior to deposition of copper fill into the via. Typically the barrier layer is deposited using a physical deposition sputtering technique. Since sputtering is a "line of sight" process, presence of notching on the via sidewall may prevent formation of a continuous barrier layer over the etched surface of the via. To avoid this problem, the etch rate of a silicon substrate, for example, has to be slowed below that which is technically possible, to reduce the notching of the sidewall which occurs.

Rapid feature etching rates may be used in combination with embodiments of the present invention which enable smoothing of etch-generated surface roughness subsequent to the etch process. The smoothing reduces the depth of notching on feature sidewall surfaces by reactive plasma milling of the sidewall surfaces. A reactive plasma milling process is used to subject the notched feature surface to a reactive plasma which is typically created from a plasma source gas which includes a reagent which reacts with the material at the surface of the etched feature. Frequently the plasma source gas includes an inert gas which does not react with the feature surface, but instead works as an impacting force which can impact the feature surface, breaking down and removing material from the tips of the notches. Typically a sidewall having an initial depth of notching of about 500 nm or less can be smoothed to exhibit a depth of notch which is about 10 nm or less, using an embodiment of the present invention.

In one exemplary embodiment, a method of reactive plasma milling an interior surface of a silicon-comprising feature to produce a smooth surface comprises removing residual polymeric materials from the interior and exterior surfaces of a silicon-comprising feature, and then treating the interior surface of the silicon-comprising feature with a reactive plasma generated from a source gas while the silicon-comprising feature is biased with a pulsed RF power. The reactive source gas includes a reagent which reacts with silicon, and an inert gas. The depth of notch which remains on a sidewall feature after the method depends on the initial depth of notch in the sidewall prior to the reactive plasma milling. In one embodiment, based on typical depth of notch produced by rapid etching to a depth of 200 μm into a silicon substrate, for example, the sidewall can be smoothed to depth of notch of less than 500 nm, typically less than 300 nm using the method. In an instance where the initial sidewall depth of notch is 500 nm or less, the depth of notch after smoothing may be less than 10 nm, as described above.

To obtain more efficient reactive plasma milling, the etchant plasma source power is generated using RF power, which is typically operated at a frequency ranging from about 10 kHz to about 60 MHZ. The amount of plasma source power applied is designed to provide a plasma density which works well with respect to the material being reactive plasma milled. In an Applied Materials, Inc. DPS II TSV Plasma Etch Chamber designed to handle a 300 mm substrate, the amount of RF power applied to obtain a desired plasma density typically ranges from about 500 Watts to about 5,000 Watts.

The reactive component of the plasma source gas is designed to react with the material which is on the surface of the etched feature to provide a gaseous by-product. When this material is a silicon-containing material, such as silicon, silicon-nitride or silicon-oxynitride, the reactive component of the plasma source gas is frequently selected from the group consisting of $SF_6$, $NF_3$, $CF_4$, $ClF_3$, $BrF_3$, $IF_3$, and combinations thereof, by way of example and not by way of limitation. With respect to silicon, $SF_6$ and $CF_4$ have produced excellent results. The volumetric ratio of the reactive component of the plasma source gas to the inert component of the plasma source gas typically ranges from about 1:0 to about 1:1, and typically ranges from about 1:0.3 to about 1:1.

To direct the plasma down into the depth of a feature which is being plasma milled, a bias is applied to the substrate (feature being plasma milled). The biasing power is RF power which is typically applied at a frequency ranging from about 10 kHz to about 13.56 MHZ. More typically, the RF power frequency ranges from about 100 kHz to about 4 MHz; and, often the RF power frequency ranges from about 100 kHz to about 400 kHz. One skilled in the art may adjust this power frequency in view of the composition of the substrate which is being reactive plasma milled.

The substrate biasing power provides improved plasma milling when the application of the biasing power is pulsed. To pulse the biasing power, the RF power is switched on and off during the plasma milling. The pulsing frequency of the biasing power typically ranges from about 10 Hz to about 1000 Hz, and more typically ranges from about 50 Hz to about 180 Hz. Frequently, but not necessarily, the switching of the power on and off is uniformly distributed in time throughout the plasma milling. However, the timing profile of the pulsing may be varied depending on the composition of the material which is reactive plasma milled. The percentage of time the plasma biasing RF power is switched on, which is referred to as the "duty time %" or the "duty cycle %" is directly related to the pulsing frequency. Typically, when the pulsing frequency ranges from about 10 Hz to about 1000 Hz, the corresponding duty time % ranges from about 2% to about 40%. When the pulsing frequency ranges from about 50 Hz to about 180 Hz, the corresponding duty time % often ranges from about 5% to about 30%. One skilled in the art may adjust the RF power frequency and the pulsing frequency to work with the particular material which is being reactive plasma milled.

When silicon is reactive plasma milled, the frequency of the RF power used to bias the substrate often ranges between about 100 kHz and about 13.56 MHZ, and frequently ranges between about 200 kHz and about 2 MHZ. The substrate biasing power in an Applied Materials, Inc. DPS II Plasma Etch Chamber capable of processing a 300 mm substrate ranges from about 0 Watts to about 300 Watts, and the amount of power applied often ranges from about 55 Watts to about 75 Watts. The bias power duty time %/pulsing frequency may range from about 1%-100%/10 Hz-1000 Hz, and often the bias power duty time/pulsing frequency applied ranges from about 5%-30%/50 Hz-180 Hz.

The plasma milling method may be used to mill other etched feature interiors, such as carbon-containing dielectric materials, where there is silicon-comprising material present on the etched feature surface, due to the use of a silicon-containing hard mask to etch the feature. For example, the composition of the plasma source gas may be adjusted to have a lower halogen content compared with the amount used to smooth the surface of a silicon substrate. However, one skilled in the art can determine an adjustment with minimal experimentation in view of the disclosure presented herein. In addition, the duty time % and the bias power pulsing frequency may also be adjusted.

The pulsing of the bias power application discussed above assists the efficiency of the reactive plasma milling by improving the selectivity for the raised areas of notches which are present on feature sidewalls. The pulsing prevents the feature surface, a via surface for example, from building up a charge that can cause ion deflection. Although the timing profile of the pulsing may be varied, depending on the kind of material which is being reactive plasma milled, we have found that a simple repeating pulsing distributed evenly over the reactive plasma milling time period works well with respect to the reactive plasma milling of silicon-containing materials, for example.

The temperature of the surface which is being reactive plasma milled is also important, as this affects the etch rate and control of uniformity of etch. The substrate surface is typically maintained at a temperature between about −5° C. and about 80° C. The temperature of the processing chamber wall is typically maintained between about 60° C. and about 80° C.

In typical embodiments, it is important to control the pressure in the processing chamber to be certain that the reaction by-products will be gaseous at the pressure and will be removed easily and relatively rapidly from the processing chamber. In addition, the processing chamber pressure affects both the smoothness of the milled surface obtained and the feature profile present after the surface smoothing. Typically the processing chamber pressure during the reactive plasma milling is controlled to be at a pressure which is within the range of about 10 mTorr to about 350 mTorr.

Earlier references have taught that it is optional to remove a photoresist mask or protective polymer films remaining on the etched feature surface prior to carrying out a processing technique to smooth rough surface sidewalls of the etched features. This teaching is incorrect and misleading. We have empirically discovered that removal of the photoresist mask at the upper surface of the etched feature and polymer film residues from the sidewalls of the etched feature is not optional, but is necessary in most embodiments. These polymeric materials react and create a porosity at the surface which is being milled. In some instances the amount of porosity may be tolerable, but in most instances it is harmful. In one embodiment, for example when the substrate is silicon, removal of these polymeric materials is done using an oxygen-containing plasma prior to initiation of the reactive plasma milling of the feature surfaces. In many embodiments, this polymer removal may be carried out in the same processing chamber in which the reactive plasma milling is carried out.

After removal of the polymeric materials, there is frequently a restriction remaining at the upper surface of the etched feature. This restriction is an extension of the sidewall of the etched feature which extension lies directly under the patterned photoresist used to pattern etch the feature. When the recessed feature is one such as a via, which is later to be filled with a conductive material, for example, it is helpful to "trim" away this wall extension which is present at the entrance to the recessed feature. In many embodiments, this trim is carried out using a plasma etch without a substrate bias, so that the plasma etching occurs at the upper surface of the substrate. The trim is advantageously carried out subsequent to removal of the photomask layer and before reactive plasma milling.

In other useful embodiments, during the reactive plasma milling of the etched feature surface, the profile of the etched feature may be altered simultaneously. This is done by adjusting processing variables such as the composition of the plasma source gas, the temperature of the substrate, the pressure in the processing chamber, and RF power variation with respect to either the plasma source gas or the substrate bias. However, the changing of one of these variables to affect the profile of the etched feature will also affect the reactive plasma milling and the milled surface roughness. In view of the teachings provided herein, one skilled in the art can, with minimal experimentation, determine which combination of variables provides the best result for a particular application.

The method of sidewall smoothing is particularly useful where the depth of the etched feature is about 2 μm or greater. Etching an opening through a substrate which is a meter or more in thickness and smoothing the sidewalls of the opening is possible, for example, using the method described herein. The sidewall smoothing may be carried out in the same processing chamber that was used for etching of the feature, or may be carried out in a separate process chambers when this is economically advantageous in terms of time and/or apparatus cost. In a multi-chambered system with robot transfer capabilities, the use of separate chambers without breaking vacuum (exposing the etched substrate to a potentially harmful environment) is available.

III. Exemplary Methods of Reactive Plasma Milling to Smooth the Surface of a Silicon-Comprising Feature

EXAMPLE ONE

As previously discussed, it is important to remove the patterned photoresist layer from the upper surface of the etched feature, and to remove the polymeric material residue from the interior of the etched feature prior to reactive plasma milling to smooth the interior surface of the feature. We have developed a method of removing the above polymeric materials. The process conditions used to strip the polymeric materials were as provided below.

TABLE ONE

Process Conditions for Photoresist Stripping & Polymer Removal

| Process Parameter | Range of Process Conditions | Typical Process Conditions |
| --- | --- | --- |
| FLOW | | |
| O2 flow rate (sccm) | 50-1000 | 100-300 |
| He flow rate (sccm) | 0-400 | 0 |
| CF$_4$ flow rate (sccm) | 10-100 | 0 |
| Ar flow rate (sccm) | 0-200 | 0 |
| RF PARAMETERS | | |
| Plasma source power (W) | 500-5000 | 1500-2500 |
| Plasma source power frequency (kHz) | 100-60,000 | 2,000-13,560 |
| Source pulsing | none | none |
| Substrate Bias power (W) | 0-300 | 0-100 |
| Biasing power frequency (kHz) | 100-13,560 | 200-2,000 |
| Bias power pulsing (duty time %/pulsing frequency Hz) | 0-100%/0-1000 Hz | 5-50%/50-180 Hz |
| Pressure (mTorr) | 10-350 | 50-100 |
| Substrate Temperature (° C.) | 50-200 | 60-90 |
| ESC temperature (° C.) | 60 to −15 | 0 to −10 |
| Chamber temperature (° C.) | 80 to 60 | 70 to 60 |
| Time (sec) | varies with resist residue thickness. | For a thickness of 1 μm, the time would be about 60 seconds. |

Figure 4A:
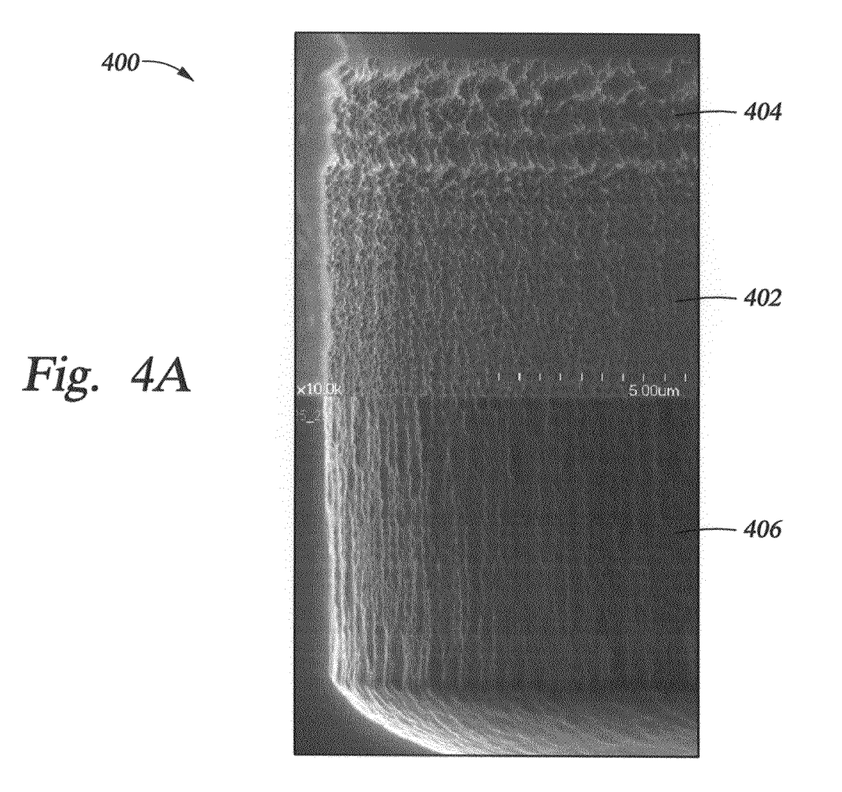
FIG. 4A shows a photomicrograph 400 of an etched silicon via 402, where the upper portion 404 of the etched via 402, near the un-stripped patterned photomask (not shown), evidences particularly high porosity, and the lower portion 406 of the etched via 402 exhibits a lesser, but potentially significant porosity.
Figure 4B:
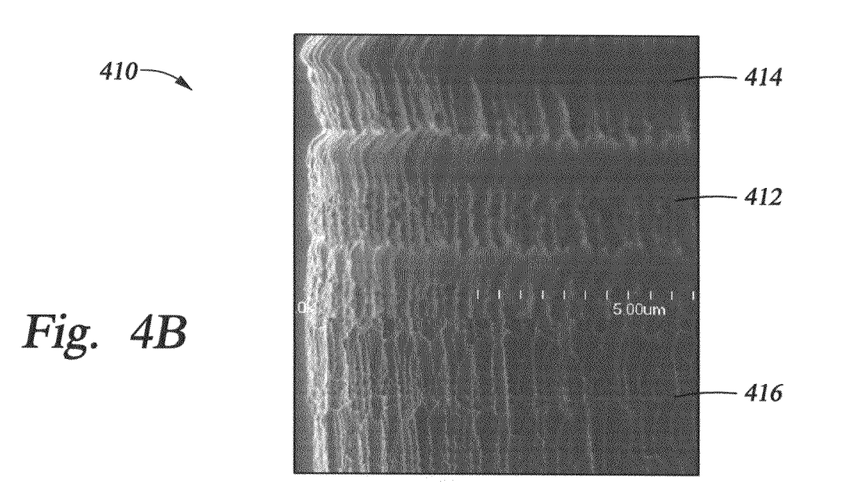
FIG. 4B shows a photomicrograph 410 of etched silicon via 412, where the upper portion 414 of the etched via 422, near the un-stripped patterned photomask (not shown), evidences a ridge-like high porosity, and the lower portion 406 of the etched via 416 exhibits a slightly lesser, but potentially significant porosity.

FIGS. 4A and 4B show the effect the presence of the photoresist and polymer residue from the feature etching has on the reactive plasma milled, smoothed surface.

FIG. 4A shows an interior via surface which has been reactive plasma milled. The via, in a silicon substrate, was exposed to a plasma created from a plasma source gas which provided SF$_6$ at 300 sccm and Helium at 200 sccm. The RF plasma source power applied was 2500 W, at a frequency of 2 MHZ. The substrate bias power applied was 400 kHz RF power at 75 W, at a pulsing frequency of 83 Hz, with a 17% duty cycle (portion of the time the bias power was turned on). The pressure in the process chamber during the reactive plasma milling was 50 mTorr. The time period of reactive plasma milling was 30 seconds. The temperature of the cathode (electrostatic chuck/ESC) which supports the substrate was −10° C. This correlates with a substrate temperature of about 70° C. The voltage applied to the ESC was 2200 V. In the area 404 at the top of the via near the photoresist layer, the effect of the photoresist polymer upon the reactive plasma milled surface is readily apparent. The effect is less as the depth into the via increases, for example at area 402. Toward the bottom of the via, at area 406, the average notch depth, $d_n$, of the wall surface at area was about 99 nm after the reactive plasma milling step. This compares with an average notch depth, $d_n$, of about 500 nm prior to the reactive milling step (reference FIG. 2A).

FIG. 4B shows the interior surface of the reactive plasma milled silicon via after exposure to a plasma created from a plasma source gas which provided SF$_6$ at 300 sccm. The reactive plasma milling processing conditions were essentially the same as recited with respect to the processed via shown in FIG. 4A. In the area 414-412 at the top of the via near the photoresist layer, the effect of the photoresist polymer upon the reactive plasma milled via surface is readily apparent. The effect is less as the depth into the via increases, and toward the bottom of the via, at area 416, the average notch depth, $d_n$, of the wall surface at area 416 shown on the photomicrograph was less than about 10 nm after the reactive plasma milling step.

FIGS. 4A and 4B illustrate the importance of removing polymeric materials prior to reactive plasma milling of the interior via surface. A comparison of the surface roughness within the via at a substantial distance away from the high polymeric concentration in the photoresist area shows that the use of argon rather than helium as an inert component in the plasma source gas has produced a smoother reactive plasma milled surface.

EXAMPLE TWO

The plasma source gas reactants and process conditions which are used during the reactive plasma milling can be adjusted to have a significant effect in terms of both the finished surface obtained and the final profile of the feature. Table Two, below, shows a number of the plasma source gas materials and process conditions which were used during experimentation leading to the present invention. This information is provided for reference purposes and is not intended to be limiting on the materials and conditions which may be used.

TABLE TWO

Process Conditions, Sidewall Smoothing Method in a DPS II TSV Processing Chamber

| Process Parameter | General Range of Process Conditions | Typical Process Conditions |
|---|---|---|
| Plasma Source Gas Component Flow Rates | | |
| SF6 flow rate (sccm) | 0-400 | 100-300 |
| C4F8 flow rate (sccm) | 0-400 | 0 |
| O2 flow rate (sccm) | 0-200 | 0-50 |
| HBr flow rate (sccm) | 0-400 | 0-70 |
| He flow rate (sccm) | 0-400 | 0-300 |
| N2 flow rate (sccm) | 0-200 | 0 |
| CF4 flow rate (sccm) | 0-50 | 0 |
| Ar flow rate (sccm) | 0-200 | 0-200 |
| RF POWER PARAMETERS | | |
| Plasma source power (W) | 500-5000 | 1500-2500 |
| Plasma source power pulsing | none | none |
| Plasma source power frequency (kHz) | 10-60,000 | 2,000-13,560 |
| Substrate bias power (W) | 0-300 | 55-75 |
| Substrate bias power pulsing (duty time %/pulsing frequency Hz) | 0-100%/10-1000 Hz | 5-50%/50-180 Hz |
| Biasing power frequency (kHz) | 100-13,560 | 200-400 |
| OTHER VARIABLES | | |
| Pressure (mTorr) | 10-350 | 50-100 |
| ESC temperature (° C.) | 60 to −15 | 0 to −10 |
| Substrate temperature (° C.) | 140 to 75 | 80 to 70 |
| Chamber temperature (° C.) | 80 to 60 | 70 to 60 |
| Reactive Plasma Milling - Sidewall Smoothing Time (sec) | 10-600 | 30-300 |

Figure 2A:
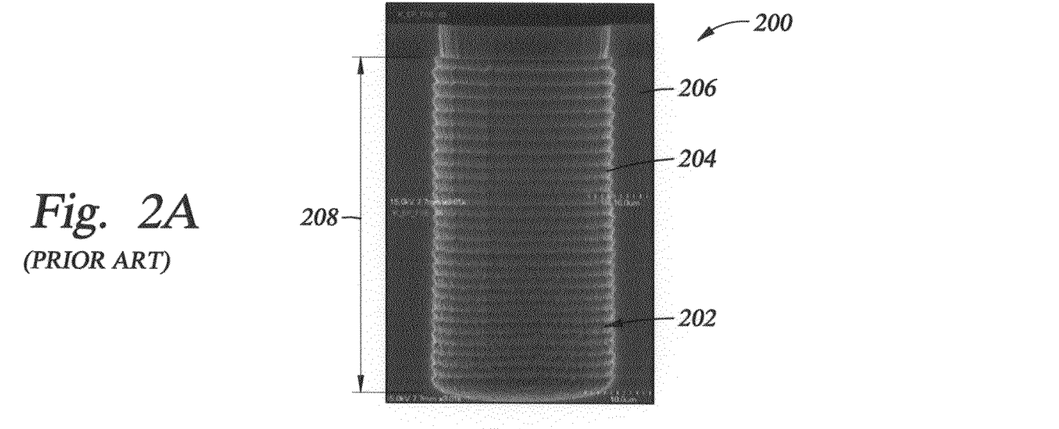
FIG. 2A shows a comparative photomicrograph 200 of an etched silicon via 202, which exhibits the typical sidewall roughness which is generated cyclic steps in a deep etch process. The depth of a notch ($d_n$) 204 into the sidewall of the via was about 0.7 μm (700 nm).

*Experimentation was carried out in an Applied Materials DPS II TSV processing chamber for 300 mm substrates FIG. 2A shows a comparative photomicrograph 200 of an etched silicon via 202, which exhibits the typical sidewall roughness generated by a deep etch process which includes cyclic steps. The etched silicon via shown in FIG. 2A is representative of the starting feature used for the various example embodiment surface smoothing methods discussed herein. The depth of the etch ($d_e$) 208 of the silicon via 202 into the silicon substrate 206 was about 50 μm. The depth of a notch ($d_n$) 204 into the sidewall of the via was about 0.7 μm (700 nm).

Figure 2B:
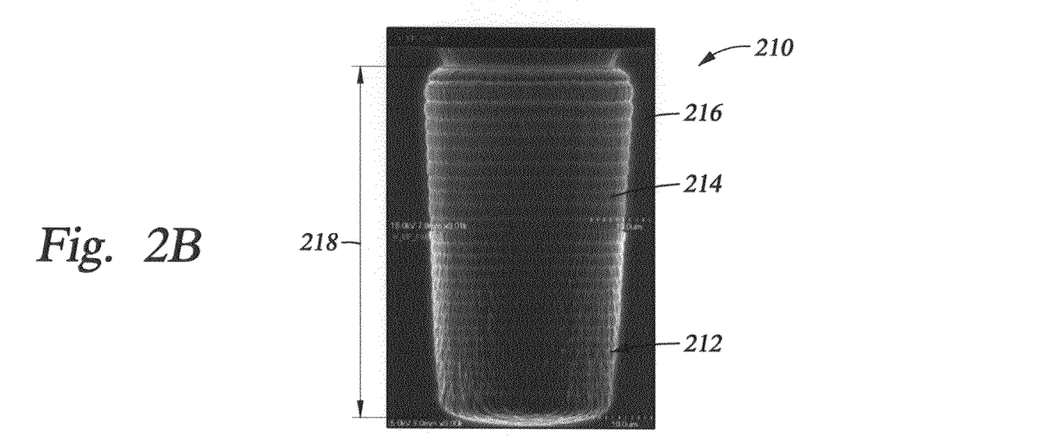
FIG. 2B shows a photomicrograph 210 of an etched silicon via 212 after reactive plasma milling of the via surface subsequent to the via etch process. The sidewall roughness was smoothed using the reactive plasma milling of the present invention. The depth of a notch ($d_n$) 214 after the reactive plasma milling (smoothing) process was about 0.33 μm (330 nm).

FIG. 2B shows a photomicrograph 210 of an etched silicon via 212, after smoothing of the interior surface of the via using an embodiment of the present invention. The silicon substrate 216 interior surface 214 shows a substantial reduction in the depth of the notching, compared with the starting surface which is illustrated in FIG. 2A. The sidewall roughness has been smoothed using the reactive plasma milling of the present invention. The depth of a notch ($d_n$) after the reactive plasma milling (smoothing) process was about 0.33 μm (330 nm). (The original depth of etch ($d_e$) 218 of the via into the silicon substrate 216 was about 50 μm.) The processing materials and conditions used to obtain a smoothing of the interior surface of the via were as follows: Plasma source gas, 300 sccm of $SF_6$ and 200 sccm of Ar. The plasma source power applied was 13.56 MHz RF power at 2500 W. The plasma source gas RF power was not pulsed. The substrate bias power applied was 400 kHz RF power at 300 W. The pulsing frequency of the bias power was 83 Hz, and the % Duty (percentage of the time the substrate bias power was on during the reactive plasma milling process) was 17%. The percentage of time the substrate bias power was on was evenly distributed over the total processing time. The pressure in the processing chamber was 90 mTorr, and the processing time period was 30 seconds. The pressure on the helium heat transfer fluid used to cool the cathode/substrate support was 8 Torr, with the cathode maintained at a temperature of −10° C. The voltage applied to the ESC to hold the substrate in place was 2200 V. The substrate bias power was pulsed (a % Duty was applied) because this assists in obtaining a smoother surface, as will be discussed subsequently herein.

EXAMPLE THREE

Figure 2C:
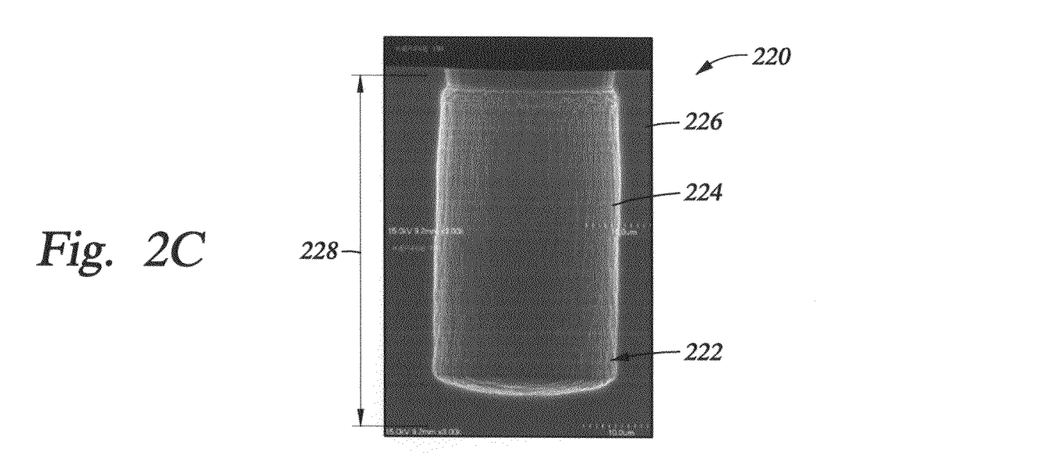
FIG. 2C shows a photomicrograph 220 of an etched silicon via 222 after reactive plasma milling of the via surface subsequent to the via etch process. The sidewall roughness has been smoothed using the reactive plasma milling of the present invention. The depth of a notch ($d_n$) 224 after the reactive plasma milling process was too small to be measured in μm (less than 10 nm).

FIG. 2C shows a photomicrograph 220 of an etched silicon via 222, which illustrates an embodiment of the present invention reactive plasma milled surface produced subsequent to the via etch process. The sidewall roughness has been smoothed using the reactive plasma milling of the present invention. The depth of a notch ($d_n$) 224 after the reactive plasma milling process was too small to be measured in μm (less than 10 nm). (The original etched silicon via depth ($d_e$) 228 was about 52 μm into the silicon substrate 226.) The processing materials and conditions used to obtain a smoothing of the interior surface of the via were essentially the same as recited with respect to FIG. 2B, with the exception that the processing chamber pressure was reduced from 90 mTorr to 50 mTorr. The change in processing chamber pressure, which was reduced from 90 mTorr to 50 mTorr decreased the depth of a notch ($d_n$) present on the via sidewall surface after the reactive plasma milling from 330 nm to less than 10 nm.

Figure 3A:
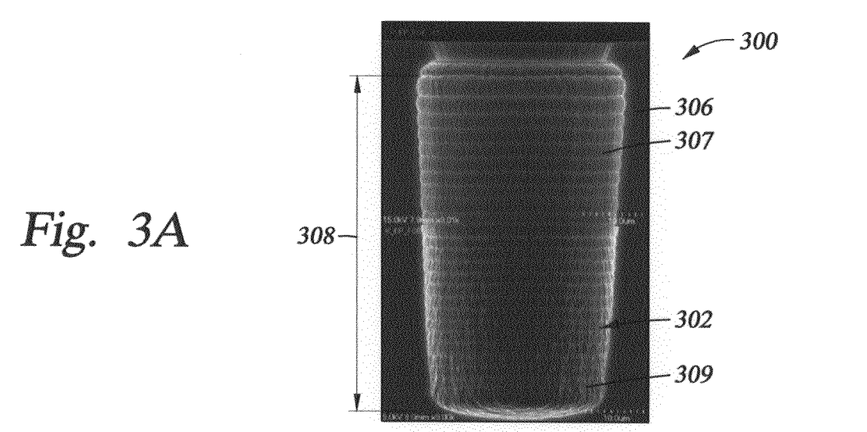
FIG. 3A shows a photomicrograph 300 of an etched silicon via 302 after reactive plasma milling which changed the via profile. The profile of the original etched via exhibited straight walls of the kind shown in FIG. 2A. Subsequent reactive plasma milling altered the profile of the via to exhibit tapered sidewalls.
Figure 3B:
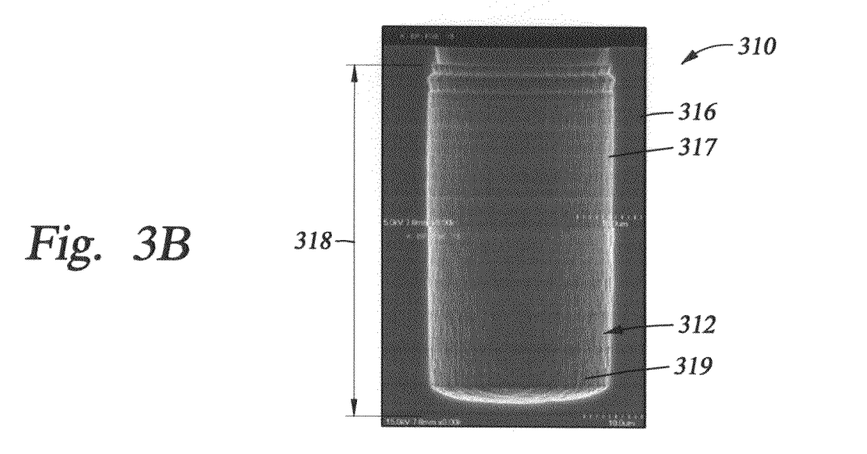
FIG. 3B shows a photomicrograph 310 of an etched silicon via 312, which illustrates another embodiment of the present invention. The profile of the original etched via exhibited straight walls of the kind shown in FIG. 2A. Subsequent reactive plasma milling did not alter the straight walls of the via.
Figure 3C:
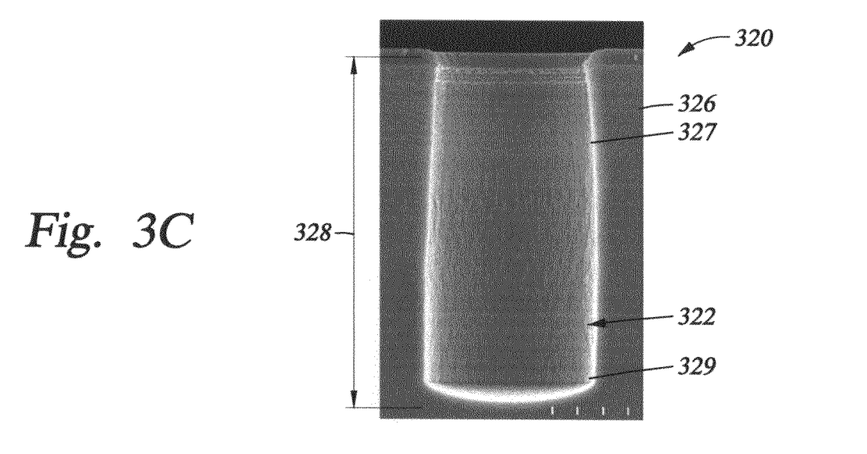
FIG. 3C shows a photomicrograph 320 of an etched silicon via 322, which illustrates yet another embodiment of the present invention. The profile of the original etched via exhibited straight walls of the kind shown in FIG. 2A. Subsequent reactive plasma milling altered the profile of the via to exhibit a re-entrant (negative) profile.

FIGS. 3A-3C show changes in profile of the etched silicon via which can be achieved during the reactive plasma milling (smoothing) process, by changing the process parameters. FIG. 3A shows the starting profile of the via prior to the reactive plasma milling.

EXAMPLE FOUR

FIG. 3A shows a photomicrograph 300 of an etched silicon via 302, which was originally etched to a depth $d_e$ 308 of about 53 μm in silicon substrate 306. The profile of the original etched via exhibited straight walls of the kind shown in FIG. 2A. Reactive plasma milling of the etched through silicon via 302 produced not only a smooth surface, but also a tapered sidewall via. In particular, the top critical dimension of the via at 307 was 25.9 μm, the bottom critical dimension of the via at 309 was 26.7 μm, and the sidewall angle was calculated to be 87.1°.

The processing materials and conditions used to obtain both a smoothing of the interior surface of the via and the tapered sidewall were as follows: Plasma source gas, 300 sccm of $SF_6$ and 200 sccm of Ar. The plasma source power applied was 13.56 MHz RF power at 2500 W. The plasma source gas RF power was not pulsed. The substrate bias power applied was 400 kHz RF power at 300 W, at a pulsing frequency of 83 Hz, and the % Duty (percentage of the time the substrate bias power was on during the reactive plasma milling process) was 17%. The percentage of time the substrate bias power was on was evenly distributed over the total processing time. The pressure in the processing chamber was 90 mTorr, and the processing time period was 30 seconds. The pressure on the helium heat transfer fluid used to cool the cathode/substrate support was 8 Torr, with the cathode maintained at a temperature of −10° C. The voltage applied to the ESC to hold the substrate in place was 2200 V.

FIG. 3B shows a photomicrograph 310 of an etched silicon via 312, which was originally etched to a depth $d_e$ 318 of about 52 μm in silicon substrate 316. The profile of the original etched via exhibited straight walls of the kind shown in FIG. 2A. After subsequent reactive plasma milling, the profile of the via continues to exhibit straight sidewalls. The top critical dimension at area 317 was 26.6 μm, the bottom critical dimension at area 319 was 28.8, and the sidewall angle was 90°.

The processing materials and conditions used to obtain both a smoothing of the interior surface of the via and the tapered sidewall were essentially the same as described above with reference to FIG. 3A, with the exception that the processing chamber pressure was reduced from 90 mTorr to 50 mTorr. The use of a 90 mTorr pressure during the reactive plasma milling process produced a sidewall angle on the finished via structure of 87.1°, while the use of a 50 mTorr process chamber pressure produced a sidewall angle on the finished via structure of 90.0°.

FIG. 3C shows a photomicrograph 320 of an etched silicon via 322, which is another embodiment of the present invention. The original depth of etch, $d_e$ 328, of the via was 59 μm. The profile of the original etched via exhibited straight walls of the kind shown in FIG. 2A. This reactive plasma milling, produced a profile of the via which is a re-entrant (negative) profile. The top critical dimension in area 327 was 22.9 μm, the bottom critical dimension in area 329 was 27.4 μm, and the sidewall angle was 92.5 degrees.

The processing materials and conditions used to obtain both a smoothing of the interior surface of the via and the tapered sidewall were as follows: Plasma source gas, 300 sccm of $SF_6$ and 200 sccm of He. The processing conditions were essentially the same as those described with reference to FIG. 3B. The principal difference between this reactive plasma milling process and the process described with respect to the via shown in FIG. 3B was that the inert component of the plasma source gas was helium rather than argon. The use of a 50 mTorr process chamber pressure and the combination of $SF_6$ with helium plasma source gas in the reactive plasma milling process produced a sidewall angle on the finished via structure of 92.5°. This compares with the 90° sidewall angle obtained when the processing chamber pressure was 50 mTorr and the plasma source gas was a combination of $SF_6$ and argon. This also compares with the 87.1° sidewall angle obtained when the processing chamber pressure was 90 mTorr and the plasma source gas was a combination of $SF_6$ and argon.

EXAMPLE FIVE

Figure 5A:
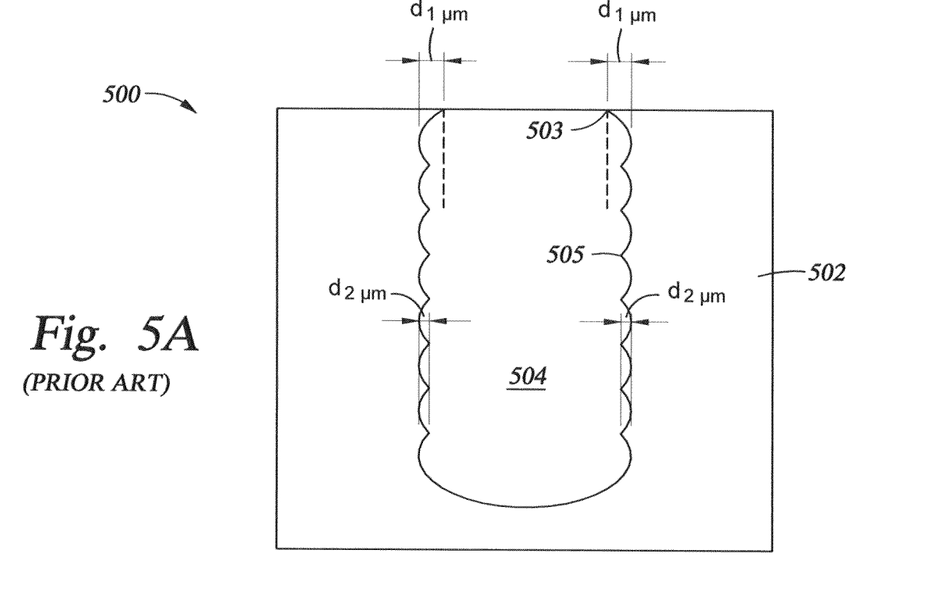
FIG. 5A illustrates the extended upper edge 503 prior to removal. The removal of upper edge 503 is advantageously carried out prior to the reactive plasma milling process to smooth the interior surface 505 of the via 504.
Figure 5B:
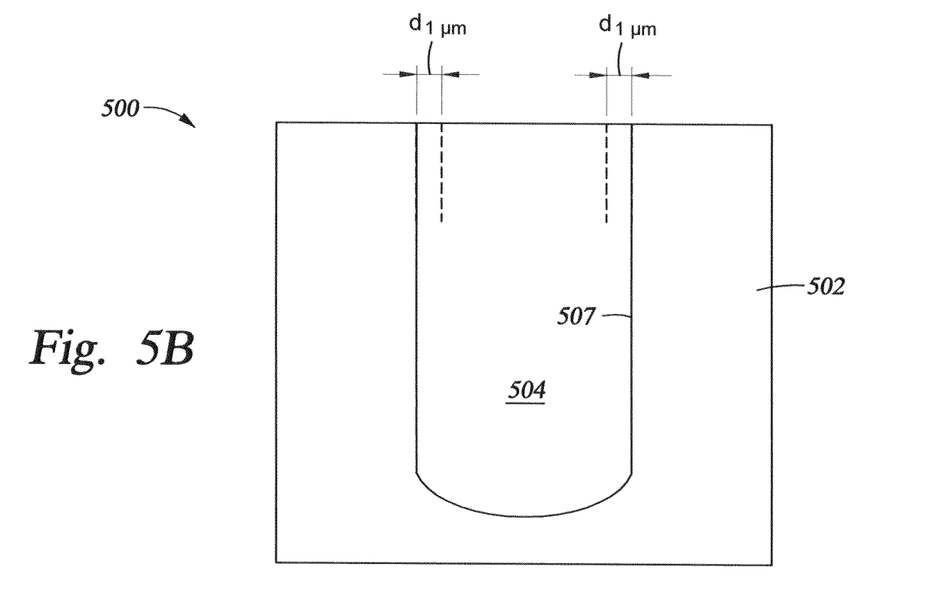
FIG. 5B illustrates the absence of the extended upper edge and the shape of the interior surface 507 of the via 504 after both the removal of the extended upper edge and after reactive plasma milling (smoothing) of the interior surface 507 of the via 504.

FIGS. 5A and 5B illustrate the removal of both an extended upper edge 503 present at the top of a via 504 and the removal of peaks 505 which are present on the sidewalls of etched via 504. The extended upper edge 503 at the top of via 504 forms beneath the patterned photoresist mask (not shown) used during plasma etching of the via 504 into substrate 502. The peaks 505 form when a cyclic (etch/protect) process is used to etch deep features into a substrate.

The extended upper edge 503 of the etched via 504 interferes with the access of reactive plasma milling agents which need to enter the via 504 to facilitate the removal of peaks 505, to provide a smooth interior wall 507. Further, this upper edge 503 causes problems if it is present at a time when it is desired to deposit a barrier layer, or to fill the via with a conductive metal, for example. As a result, there is an advantage to removing the extended upper edge 503 prior to the reactive plasma milling process for smoothing the sidewalls of the via. Further, Since the distance $d_1$ from the upper extended edge 503 to the finished, smoothed sidewall 507 is larger than the distance $d_2$ of the peaks 505 to the finished, smoothed sidewall 507, it is difficult to remove upper edge 503 in the same process used to remove peaks 505.

A "trim" process which may be used to remove the extended upper edge 503 may be the process described with reference to the reactive plasma milling process, but without a bias on the substrate. In some instances, an increased amount of argon may be used to provide additional physical surface bombardment.

While the foregoing is directed to embodiments of the present invention, other and further embodiments of the invention may be devised in view of the present disclosure, without departing from the basic scope of the invention, and the scope thereof is determined by the claims which follow.

We claim:

1. A method of reactive plasma milling to smooth an interior surface of a silicon-comprising feature subsequent to etching of the feature, said method comprising:
removing residual polymeric materials from an interior surface of an etched silicon-comprising feature; followed by
treating said interior surface of said etched silicon-comprising feature with a reactive plasma generated from a source gas which includes a reagent which reacts with silicon and an inert gas, while a substrate comprising said silicon-comprising feature is biased with a pulsed RF power, and wherein a pulsing frequency ranges from about 10 Hz to about 1000 Hz and a duty time % ranges from about 2% to about 40%, so that a milled interior surface of said etched silicon-comprising feature has a depth of notch of 700 nm or less.

2. A method in accordance with claim 1, wherein said reactive plasma is generated using about 10 kHz to about 60 MHZ RF power and said substrate biasing is carried out using 10 kHz to about 13.56 MHZ RF power.

3. A method in accordance with claim 1, wherein said substrate comprising said feature is biased with a pulsed RF power where the pulsing frequency ranges from about 50 Hz to about 180 Hz and the duty time % ranges from 5% to 30%.

4. A method in accordance with claim 3, wherein said treating of said interior surface of said etched feature is carried out for a time period sufficient to reduce a depth of notch on said interior surface of said silicon-comprising etched feature to a depth of 300 nm or less.

5. A method in accordance with claim 4, wherein said depth of notch after treatment ranges from 5 nm to about 100 nm.

6. A method in accordance with claim 1, wherein said etched feature is a via and wherein a profile of said via is simultaneously altered while said interior surface of said via is smoothed.

7. A method in accordance with claim 6, wherein said profile is altered by selecting of a composition of an inert gas which is used to bombard said interior surface during said treating of said interior surface.

8. A method in accordance with claim 5 or claim 6, wherein said profile is altered by selecting a pressure in a process chamber in which said treating of said interior surface is carried out.

9. A method in accordance with claim 1, wherein, subsequent to removing said residual polymeric material, and prior to treating said interior surface of said silicon-comprising feature with said reactive plasma, polymeric material is removed surrounding an opening to said silicon-comprising feature.

10. A method of smoothing an interior sidewall surface of a previously etched opening which passes through a silicon-comprising substrate, said method comprising:
removing any residual photoresist from an exterior substrate surface through which said opening was etched; and
removing residual protective polymeric material which was deposited on said interior sidewall surface of said opening during etching of said opening; followed by
treating said interior sidewall surface of said previously etched opening with a reactive plasma generated from a source gas which includes a reagent which reacts with silicon and an inert gas, while said silicon-comprising substrate is biased with a pulsed RF power, and wherein said pulsing frequency ranges from about 10 Hz to about 1000 Hz and the duty time % ranges from 2% to 50% so that a smoothed interior sidewall surface of said previously etched opening has a depth of notch of 700 nm or less.

11. A method in accordance with claim 10, wherein said substrate comprising said opening is biased with a pulsed RF power where the pulsing frequency ranges from about 50 Hz to about 180 Hz and the duty time % ranges from 5% to 30%.

12. A method in accordance with claim 11, wherein the RF power frequency used to bias said substrate ranges from about 200 kHz to about 2,000 kHz.

13. A method in accordance with claim 11, wherein said treating of said interior sidewall surface of said etched opening is carried out for a time period sufficient to reduce a depth of notch on said interior sidewall surface to a depth of 300 nm or less.

14. A method in accordance with claim 13, wherein said depth of notch after treatment ranges from 5 nm to about 100 nm.

15. A method in accordance with claim 10, wherein, subsequent to removing any residual photoresist and any residual protective polymeric materials from said interior sidewall surface of said opening, and prior to treating said interior sidewall surface of said silicon-comprising etched opening with a smoothing reactive plasma, polymeric material is removed surrounding an entryway to said previously etched opening.

16. A method in accordance with claim 1, wherein there is residual photoresist present on an exterior surface of said silicon comprising feature, and wherein said residual photoresist is removed in addition to removing said residual polymeric materials from said interior surface of said etched silicon-comprising feature, followed by treating of said interior surface of said etched silicon-comprising feature.

* * * * *